(12) United States Patent
Sakurai

(10) Patent No.: US 9,865,463 B2
(45) Date of Patent: Jan. 9, 2018

(54) METHOD OF MANUFACTURING A SEMICONDUCTOR DEVICE

(71) Applicant: SII Semiconductor Corporation, Chiba-shi, Chiba (JP)

(72) Inventor: Hitomi Sakurai, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 15/193,367

(22) Filed: Jun. 27, 2016

(65) Prior Publication Data

US 2017/0005174 A1    Jan. 5, 2017

(30) Foreign Application Priority Data

Jun. 30, 2015 (JP) ................... 2015-131483
Mar. 2, 2016 (JP) ................... 2016-040080

(51) Int. Cl.
| | |
|---|---|
| *H01L 21/3205* | (2006.01) |
| *H01L 21/027* | (2006.01) |
| *H01L 21/28* | (2006.01) |
| *H01L 29/66* | (2006.01) |

(52) U.S. Cl.
CPC .... *H01L 21/0273* (2013.01); *H01L 21/28123* (2013.01); *H01L 29/66575* (2013.01); *H01L 2224/80874* (2013.01); *H01L 2224/8188* (2013.01); *H01L 2224/81874* (2013.01)

(58) Field of Classification Search
CPC ............................ H01L 29/435; H01L 29/401
USPC ....................................................... 438/585
See application file for complete search history.

(56) References Cited

U.S. PATENT DOCUMENTS

| 7,189,646 | B2 * | 3/2007 | Huang ................ H01L 21/4853 |
| | | | 257/E21.023 |
| 8,592,922 | B2 * | 11/2013 | Hooker ............. H01L 21/82384 |
| | | | 257/204 |
| 2009/0057927 | A1 * | 3/2009 | Choe ................... H01L 21/0272 |
| | | | 257/786 |
| 2015/0301454 | A1 * | 10/2015 | Kanome ............. H01L 27/1461 |
| | | | 438/60 |

OTHER PUBLICATIONS

Seigo Kishino "Basic VLSI material and process" Ohmsha, Ltd., (Dec. 25, 1987), pp. 10-13.

\* cited by examiner

*Primary Examiner* — Vu A Vu
(74) *Attorney, Agent, or Firm* — Adams & Wilks

(57) ABSTRACT

In a method of manufacturing a semiconductor device, a first photoresist layer is applied on a polycrystalline silicon layer formed on a semiconductor substrate. The first photoresist layer is then patterned and cured with UV rays. The polycrystalline silicon layer is etched, using the first photoresist layer as a mask, to form a gate electrode and a resistive film of the polycrystalline silicon layer. A second photoresist layer is applied on the cured first photoresist layer and patterned to form an opening portion exposing the first photoresist layer. Impurities are ion implanted through the opening portion in the polycrystalline silicon layer. The channeling of impurities implanted during the ion implantation is suppressed by the cured first photoresist layer.

12 Claims, 2 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device, and more particularly, to a method of manufacturing an ion-implanted impurity layer with respect to a pattern of a polycrystalline silicon layer in a self-alignment manner.

2. Description of the Related Art

Self-alignment formation of impurity layers with respect to a pattern of a polycrystalline silicon layer is used for, for example, forming impurity layers of source/drain regions of transistors in manufacturing of conventional MOS transistors, which includes the following steps.

First, as illustrated in FIG. 2A, for example, an element isolation insulating film 12 and a gate insulating film 13 are formed on a silicon substrate 11. Subsequently, a polycrystalline silicon layer 14 is formed on the entire surface of the silicon substrate 11, and photoresist is then applied thereon. The resultant is exposed with a photomask corresponding to patterning of the polycrystalline silicon layer 14, to thereby form a first photoresist layer 15.

Next, as illustrated in FIG. 2B, the polycrystalline silicon layer 14 is removed by etching with the first photoresist layer 15 being a mask material, to thereby form gate electrodes 14-1 and 14-2 and a resistor 14-3 of the polycrystalline silicon layer 14, and wiring is formed. The first photoresist layer 15 is thereafter removed.

Next, as illustrated in FIG. 2C, a second photoresist layer 16 is patterned so that a source and a drain of a MOS transistor including a desired electrode, for example, the gate electrode 14-1 may be formed in desired regions. Source/drain impurity layers 17 are then selectively formed by ion implantation.

At this time, the opening portion of the second photoresist layer 16, through which ion implantation of impurities is performed, is formed not only above the desired source/drain regions of the MOS transistor, but also above the gate electrode 14-1. Thus, the gate electrode 14-1 functions as a mask for ion implantation, thereby enabling the source/drain impurity layers 17 to be formed to the gate electrode 14-1 in a self-alignment manner.

Manufacturing MOS transistors through those steps has the following advantages.
(1) It is not necessary to take misalignment between source/drain impurity layers and gate electrodes in photoresist pattern processing into consideration, and hence transistors can be miniaturized.
(2) It is not necessary to form a photoresist pattern for source/drain impurity layers needlessly finely, and hence at least the source/drain impurity layers can be formed more easily.

As described above, such a MOS transistor is formed that includes the source/drain impurity layers formed to the gate electrode pattern of the polycrystalline silicon layer in a self-alignment manner.

In addition, as illustrated in FIG. 2D, as needed, the above-mentioned step of FIG. 2C is repeatedly performed on desired regions in a MOS transistor including, for example, the gate electrode 14-2 as its electrode, to thereby form source/drain impurity layers 18 so that a plurality of kinds of MOS transistors can be formed.

MOS transistors including source/drain impurity layers formed in a self-alignment manner and methods of manufacturing the MOS transistor are well known. For example, in Seigo Kishino, "Basic VLSI material and process", Ohmsha, Ltd., Dec. 25, 1987, pp. 11-12, there is disclosed a method of forming a source/drain impurity layer of a MOS transistor through the above-mentioned steps.

However, the following problems are found in the method of manufacturing a MOS transistor disclosed in Seigo Kishino, "Basic VLSI material and process", Ohmsha, Ltd., Dec. 25, 1987, pp. 11-12.

A polycrystalline silicon layer, which is generally used as gate electrodes of transistors, is formed of an aggregate of single crystal grains. Thus, due to a channeling phenomenon in which implanted impurities pass through gaps between grains during ion implantation of source/drain impurities, impurities penetrate gate electrodes formed of a polycrystalline silicon layer, with the result that the impurities are also implanted into channel regions of transistors, which are formed in a silicon substrate and located below the gate electrodes.

This is a cause of greatly varying impurity concentrations of the channel regions, each of which is one important factor for determining a threshold of the transistor, and thus hinders stable transistor performance.

SUMMARY OF THE INVENTION

In view of the foregoing, it is an object of the present invention to provide a method of manufacturing a MOS transistor capable of preventing a channeling phenomenon, and stabilizing a threshold of the transistor.

In order to achieve the above-mentioned object, according to one embodiment of the present invention, an impurity layer is formed with respect to a pattern of a polycrystalline silicon layer in a self-alignment manner by the following procedures.
(1) Ion implantation of impurities is performed with a first photoresist layer that has been used for patterning of the polycrystalline silicon layer and has remained.
(2) A second photoresist layer for an impurity layer is patterned and ion implantation of impurities is performed with the first photoresist layer that has been used for patterning of the polycrystalline silicon layer and has remained.

According to the present invention, the ion implantation for forming the impurity layer is performed with the first photoresist layer remaining on the pattern of the polycrystalline silicon layer, and hence the following effects are provided.
(1) A channeling phenomenon, which may occur during ion implantation through the pattern of the polycrystalline silicon layer, can be suppressed. Thus, for example, even when source/drain impurity layers of a MOS transistor are formed to a gate electrode of the polycrystalline silicon layer by ion implantation in a self-alignment manner, impurities are not implanted into a channel region of the transistor. It is therefore possible to stabilize a threshold of the transistor.
(2) It is not necessary to remove the first photoresist layer formed on the pattern of the polycrystalline silicon layer before ion implantation, and the first photoresist layer can be removed in a subsequent photoresist removing step, for example, a step of removing the second photoresist layer. As a result, the number of steps can be reduced.

DETAILED DESCRIPTION OF THE INVENTION

In the following, an embodiment of the present invention is described with reference to the drawings.

Figure 1A:
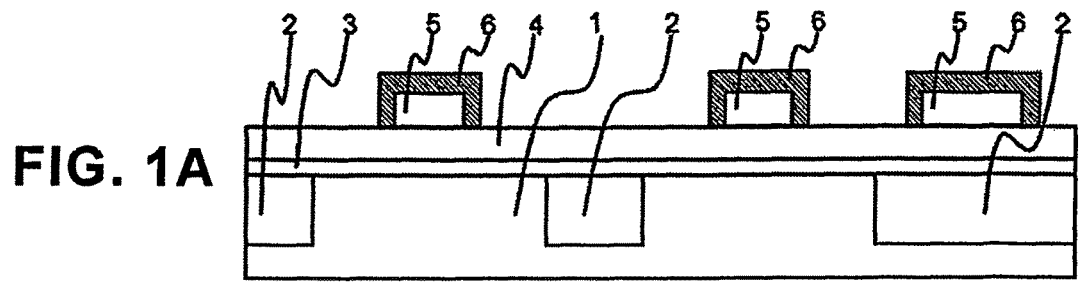
FIG. 1A to FIG. 1D are sectional views for illustrating steps of a method of manufacturing a semiconductor device according to the present invention in order.

First, as illustrated in FIG. 1A, for example, an element isolation insulating film 2 and a gate insulating film 3 are formed on a silicon substrate 1. Subsequently, a polycrystalline silicon layer 4 is formed on the entire surface of the silicon substrate 1, and a photoresist is then applied thereon. The resultant is exposed with a photomask corresponding to patterning of the polycrystalline silicon layer 4, to thereby form a first photoresist layer 5.

Subsequently, the surface of the silicon substrate, on which the first photoresist layer 5 is patterned, is irradiated with ultraviolet (UV) rays, to thereby form a cured-resist layer 6 having solvent resistance and exposure resistance on the surface of the photoresist layer 5.

The cured-resist layer 6 having intended solvent resistance and exposure resistance can be formed as long as UV irradiation at this time is performed while satisfying range conditions of a temperature of from 170° C. to 190° C. and a UV exposure dose of from 12 J/cm$^2$ to 15 J/cm$^2$.

In general, after exposing and developing photoresists to form patterns, there is a step of baking the resultants at slightly high temperature to discharge organic solvents in the photoresists to the outside, thereby densifying resist layers. However, the effects of solvent resistance and exposure resistance provided to the surfaces of the photoresist layers by such simple baking are supposed to be insufficient.

Figure 1B:
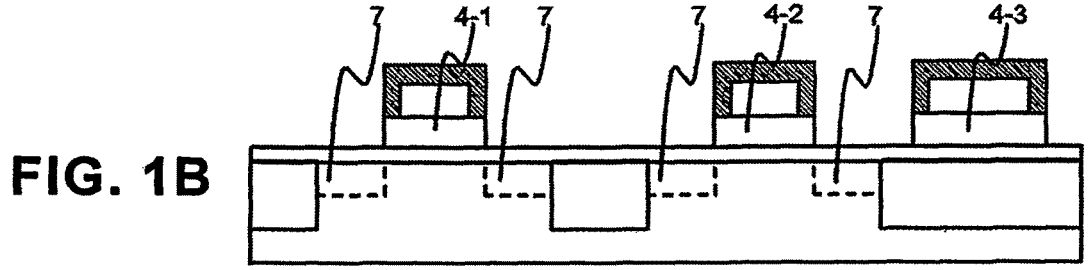

Next, as illustrated in FIG. 1B, the polycrystalline silicon layer 4 is removed by etching with, as a mask material, the first photoresist layer 5 having the cured-resist layer 6, to thereby form gate electrodes 4-1 and 4-2 and a resistive film 4-3 of the polycrystalline silicon layer 4, and wiring is formed. As the gate electrodes and the resistive film, other than polycrystalline silicon layers, high-melting-point metals, such as titanium, tantalum, and tungsten, or single layer films or laminated films thereof, e.g., metal silicide thereof may be used.

Subsequently, if needed, ion implantation may be performed on the entire surface of the silicon substrate 1 with the first photoresist layer having the cured-resist layer 6, which remains on the gate electrodes 4-1 and 4-2, the resistive film 4-3, and the wiring, to thereby form, in a self-alignment manner, source/drain impurity layers 7 to the gate electrodes 4-1 and 4-2 formed of the polycrystalline silicon layer. By virtue of the first photoresist layer 5 having the cured-resist layer 6 formed on the gate electrodes 4-1 and 4-2, the resistive film 4-3, and the wiring, channeling of impurity ions implanted by ion implantation can be suppressed.

Figure 1C:
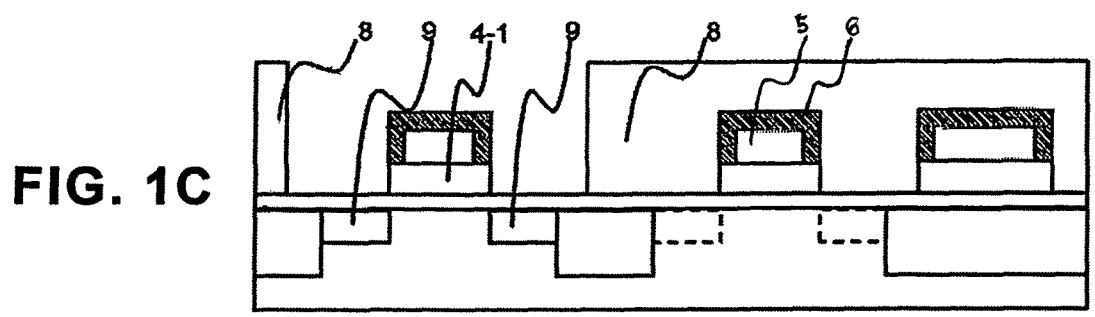

Next, as illustrated in FIG. 1C, a second photoresist layer 8 is applied on the first photoresist layer 5 having the cured-resist layer 6, and is then patterned. The first photoresist layer 5 is formed in a pattern, and further the polycrystalline silicon layer 4, which is an underlayer of the first photoresist layer 5, is etched. Thus, on the surface of the silicon substrate, there are levels formed of the thickness of the first photoresist layer 5 and the thickness of the polycrystalline silicon layer 4. Those levels may prevent the second photoresist layer 8 from spreading, to thereby cause coating unevenness. The coating unevenness described above can be avoided by using, for resist application in forming of the second photoresist layer, resist in a dropping amount greater than a dropping amount of resist for resist application in forming of the first photoresist layer. The same is also true for forming of a third photoresist layer described later. The coating unevenness described above can be avoided by using, for resist application in forming of the third photoresist layer, resist in a dropping amount greater than the dropping amount of resist for resist application in forming of the first photoresist layer. The dropping amount of resist in forming of the second photoresist layer may be the same as the dropping amount of resist in forming of the third photoresist layer. The coating unevenness can also be avoided with the use of a technique of using, for resist application in forming of the second and third photoresist layers, resist having viscosity greater than viscosity of resist for resist application in forming of the first photoresist layer.

Next, an opening portion is formed in the second photoresist layer 8 so that a source and a drain of a MOS transistor including a desired electrode, for example, the gate electrode 4-1 may be formed in desired regions. Source/drain impurity layers 9 are then selectively formed by ion implantation. The first photoresist layer 5, which is formed first and has the cured-resist layer 6, is exposed in the opening portion.

The opening portion of the second photoresist layer 8, through which ion implantation of impurities is performed, is formed not only above the desired source/drain regions of the MOS transistor, but also above the gate electrode 4-1. However, a double-resist method is employed in which the second photoresist layer 8 is formed on the first photoresist layer 5, and hence desired gate electrodes can be selectively masked with the first photoresist layer. Thus, ion implantation of impurities can be selectively performed to, in a self-alignment manner, the gate electrodes formed of the polycrystalline silicon layer so that impurities can only be implanted into desired portions. By virtue of the first photoresist layer 5 having the cured-resist layer 6 formed on the gate electrode 4-1, channeling of impurity ions implanted by ion implantation can be suppressed.

Manufacturing MOS transistors through those steps has the following advantages.

(1) It is not necessary to take misalignment between source/drain impurity layers and gate electrodes in photoresist pattern processing into consideration, and hence transistors can be miniaturized.

(2) It is not necessary to form a photoresist pattern for source/drain impurity layers needlessly finely, and hence at least the source/drain impurity layers can be formed more easily.

(3) By virtue of the photoresist layer formed on the gate electrodes formed of the polycrystalline silicon layer, channeling during ion implantation can be suppressed.

(4) It is not necessary to remove the first photoresist layer formed on the pattern of the polycrystalline silicon layer before ion implantation, and the first photoresist layer can be removed in a subsequent photoresist removing step, for example, a step of removing the second photoresist layer. As a result, the number of steps can be reduced.

Further, the cured-resist layer 6 is formed on the first photoresist layer 5 as illustrated in FIG. 1A referred to above, and hence, a solvent does not reach the first photoresist layer 5 when the second photoresist layer 8 is applied. Thus, the pattern of the first photoresist layer is not damaged.

In addition, when the second photoresist layer 8 needs to be reworked, the surface of the silicon substrate, on which the second photoresist layer is applied or patterned, is entirely exposed without using a photomask. The reworking can be performed in this manner. Exposure resistance and solvent resistance are maintained by the cured-resist layer 6 even when the second photoresist layer is patterned to expose the first photoresist layer 5, and hence the first photoresist layer is not affected by the exposure of the entire surface and alkali solvent treatment thereafter for removing the second photoresist layer. In this way, such a MOS transistor is formed that includes the source/drain impurity layers formed to the gate electrode pattern of the polycrystalline silicon layer in a self-alignment manner.

Further, the effects of exposure resistance and solvent resistance can also be obtained when the cured-resist layer 6 is formed by UV irradiation after etching of the polycrystalline silicon layer 4 instead of after patterning of the first photoresist layer 5. However, the first photoresist layer is generally degenerated through densification by UV irradiation, and hence the first photoresist layer 5 having the cured-resist layer 6 is formed on the inner side of the etched pattern of the polycrystalline silicon layer 4, and the surface of the polycrystalline silicon layer is exposed in a portion where the resist is degenerated.

In the subsequent step of ion implantation of source/drain impurities, if the cured-resist layer 6 is not formed, only the polycrystalline silicon layer functions as a mask material for this exposed portion of the surface of the polycrystalline silicon layer. Thus, due to channeling of ion implantation, which is described as a problem above, impurities are also implanted into the channel regions of the transistors, which are formed in the silicon substrate and located below the gate electrodes, with the result that thresholds of the transistors greatly vary. If the influence of channeling is strong, source/drain regions are also formed immediately below the exposed portion of the surface of the polycrystalline silicon layer. As a result, it becomes difficult to form the source/drain impurity layers to the gate electrode pattern in a self-alignment manner.

On the other hand, when the cured-resist layer 6 is formed by UV irradiation after patterning of the first photoresist layer 5 and before etching of the polycrystalline silicon layer 4 as described in the embodiment of the present invention, the polycrystalline silicon layer is etched with a degenerated photoresist pattern being a mask. Thus, all the upper surfaces of the gate electrodes formed of the etched polycrystalline silicon layer can be in a state of being covered by the first photoresist layer having the cured-resist layer 6, and hence the first photoresist layer having the cured-resist layer 6 functions as a complete mask material for ion implantation of source/drain impurities. Thus, formation of source/drain impurity layers to the gate electrodes in a self-alignment manner, and prevention of channeling can be perfectly performed.

Figure 1D:
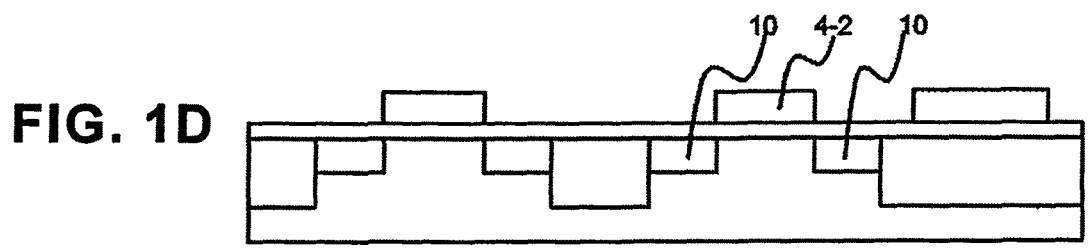
Figure 2A:
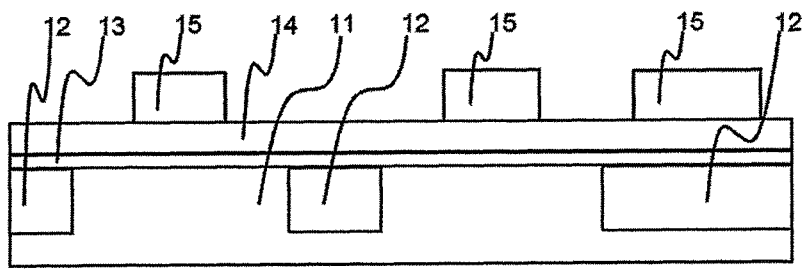
FIG. 2A to FIG. 2D are sectional views for illustrating steps of a related-art method of manufacturing a semiconductor device in order.
Figure 2B:
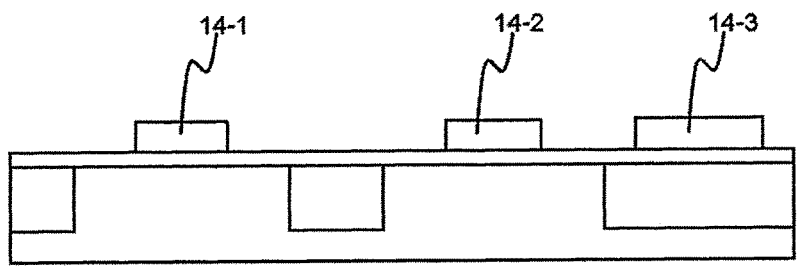
Figure 2C:
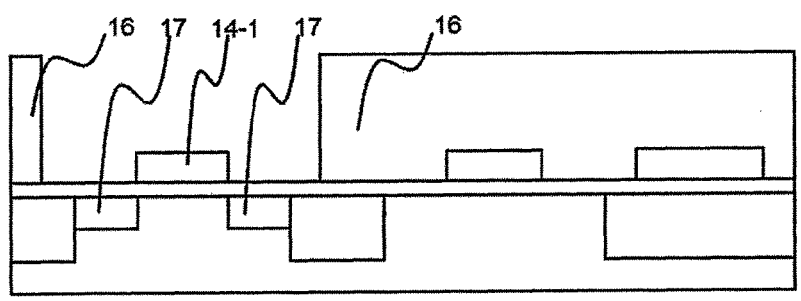
Figure 2D:
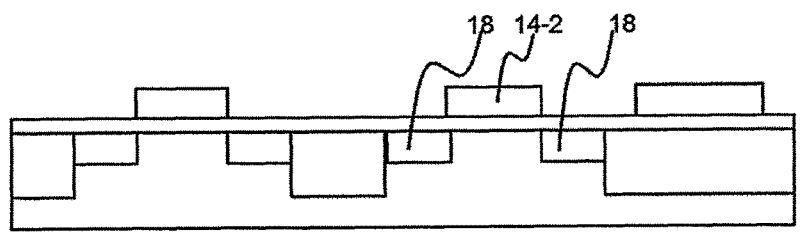

In addition, as illustrated in FIG. 1D, if needed, the above-mentioned step of FIG. 1C is repeatedly performed on desired regions in a MOS transistor including, for example, the gate electrode 4-2 as its electrode, to thereby form source/drain impurity layers 10 so that a plurality of kinds of MOS transistors can be formed. That is, a plurality of kinds of MOS transistors can be formed by repeatedly performing the following steps while changing photoresist layers to be applied, opening portions, and impurities. Specifically, after the second photoresist layer is selectively removed, the third photoresist layer is applied on the first photoresist layer and is then patterned to form a second opening portion in part of the third photoresist layer, thereby exposing the first photoresist layer in this second opening portion. Then, second impurities are implanted through the second opening portion by ion implantation to form source/drain impurity layers.

When the step of FIG. 10 is repeatedly performed, photoresist layers for source/drain impurity layers, which are formed, as double resists, on the first photoresist layer formed on the polycrystalline silicon layer can be removed by a wet process, that is, only with a photoresist removing solvent as long as concentration of ion implantation for the source/drain impurity layers is equal to or less than $5\times10^{14}$ atms/cm$^2$. Thus, as long as the solvent resistance of the first photoresist layer having the cured-resist layer lasts, formation of photoresist layers for impurity layers and ion implantation can be performed a plurality of times with the first photoresist layer remaining on the polycrystalline silicon layer.

Meanwhile, the first photoresist layer having the cured-resist layer is subjected to ashing of photoresist, which is generally applied to photoresist layers after high-concentration implantation and other processes. The first photoresist layer 5 has the cured-resist layer 6 only on its resist surface portion, and hence the cured-resist layer 6 can be removed by ashing. After removal of the cured-resist layer 6, both of the first photoresist layer and the photoresist layers formed as the double resists can be removed with an ordinary photoresist removing solvent.

As a matter of course, after removal of the photoresist layers formed as the double resists, the first photoresist may be subjected to ashing and the first photoresist may be removed with a solvent without any problem.

Note that, the source/drain impurity layers of the present invention are not limited to highly-doped N-type or P-type impurity layers, and include portions forming sources and drains in completed MOS transistors, for example, lightly doped drains (LDD), double diffused drains (DDD), and pocket implant doped layers or halo implant doped layers serving as a punch-through stopper between a source and a drain.

Similarly, in the present invention, the method of manufacturing a source/drain impurity layer of a MOS transistor is described as an example. Needless to say, however, the present invention is not limited thereto and can be applied to a method of manufacturing an impurity layer for forming impurity layers with respect to a pattern of a polycrystalline silicon layer in a self-alignment manner.

What is claimed is:

1. A method of manufacturing a semiconductor device, for forming, in a self-alignment manner, an impurity layer with respect to a pattern of a polycrystalline silicon layer formed on a semiconductor substrate, the method comprising:

forming the polycrystalline silicon layer directly on the semiconductor substrate;

applying, on the polycrystalline silicon layer, a first photoresist layer, and then patterning the first photoresist layer;

irradiating the patterned first photoresist layer with UV rays;

forming a gate electrode and a resistive film of the polycrystalline silicon layer by etching the polycrystalline silicon layer using the first photoresist layer irradiated with the UV rays as a mask;

applying a second photoresist layer on the first photoresist layer irradiated with the UV rays, and then patterning the second photoresist layer to form an opening portion in part of the second photoresist layer, to thereby expose the first photoresist layer in the opening portion; and implanting first impurities into the opening portion by ion implantation.

2. A method of manufacturing a semiconductor device according to claim 1, further comprising, after the implanting first impurities by ion implantation:
removing the second photoresist layer;
applying a third photoresist layer on the first photoresist layer, and then patterning the third photoresist layer to form a second opening portion in part of the third photoresist layer, to thereby expose the first photoresist layer in the second opening portion; and
implanting second impurities into the second opening portion by ion implantation.

3. A method of manufacturing a semiconductor device according to claim 2, wherein the removing the second photoresist layer comprises using a photoresist removing solvent.

4. A method of manufacturing a semiconductor device according to claim 1, wherein the opening portion is formed at least on a source/drain impurity layer forming region of a MOS transistor.

5. A method of manufacturing a semiconductor device according to claim 1, further comprising, after the forming a gate electrode and a resistive film of the polycrystalline silicon layer, performing ion implantation on an entire surface of the semiconductor substrate with the first photoresist layer that has been irradiated with the UV rays and has remained, to thereby form, in a self-alignment manner, a source/drain impurity layer to the gate electrode formed of the polycrystalline silicon layer.

6. A method of manufacturing a semiconductor device according to claim 1, wherein the irradiating the patterned first photoresist layer with UV rays is performed after the patterning the first photoresist layer, and before the etching the polycrystalline silicon layer.

7. A method of manufacturing a semiconductor device according to claim 2, wherein the irradiating the patterned first photoresist layer with UV rays is performed after the patterning the first photoresist layer, and before the etching the polycrystalline silicon layer.

8. A method of manufacturing a semiconductor device according to claim 1, wherein, in forming of the second photoresist layer, resist in a dropping amount greater than a dropping amount of resist that is used in forming of the first photoresist layer is used.

9. A method of manufacturing a semiconductor device according to claim 2, wherein, in forming of the third photoresist layer, resist in a dropping amount greater than a dropping amount of resist that is used in forming of the first photoresist layer is used.

10. A method of manufacturing a semiconductor device according to claim 1, wherein, in forming of the second photoresist layer, resist having viscosity greater than viscosity of resist that is used in forming of the first photoresist layer is used.

11. A method of manufacturing a semiconductor device according to claim 2, wherein, in forming of the third photoresist layer, resist having viscosity greater than viscosity of resist that is used in forming of the first photoresist layer is used.

12. A method of manufacturing a semiconductor device according to claim 1, wherein the forming the gate electrode and the resistive film is carried out using as a mask only the first photoresist layer irradiated with the UV ray.

* * * * *